United States Patent
Chung et al.

(10) Patent No.: US 9,991,473 B2
(45) Date of Patent: Jun. 5, 2018

(54) ORGANIC LIGHT EMITTING DISPLAY DEVICE

(71) Applicant: Samsung Display Co., Ltd., Yongin, Gyeonggi-Do (KR)

(72) Inventors: Jin-Koo Chung, Suwon-si (KR); Jun-Ho Choi, Yongin-si (KR); Kyung-Ho Kim, Seoul (KR); Eun-Kyoung Nam, Hwaseong-si (KR); Jeong-Woo Moon, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 86 days.

(21) Appl. No.: 14/803,252

(22) Filed: Jul. 20, 2015

(65) Prior Publication Data
US 2016/0240818 A1    Aug. 18, 2016

(30) Foreign Application Priority Data
Feb. 16, 2015    (KR) .................... 10-2015-0023490

(51) Int. Cl.
*H05B 33/22* (2006.01)
*H01L 51/52* (2006.01)
*H01L 27/32* (2006.01)

(52) U.S. Cl.
CPC ...... *H01L 51/5271* (2013.01); *H01L 27/3276* (2013.01); *H01L 51/5281* (2013.01)

(58) Field of Classification Search
CPC ............. H01L 51/5271; H01L 51/5281; H01L 27/3213; H01L 27/3211; G02F 1/133512; G02F 1/133553

USPC .......................................................... 313/504
See application file for complete search history.

(56) References Cited

U.S. PATENT DOCUMENTS

| | | | |
|---|---|---|---|
| 2003/0151354 A1* | 8/2003 | Takizawa | G02F 1/133553 313/498 |
| 2009/0236981 A1 | 9/2009 | Chang et al. | |
| 2011/0227099 A1* | 9/2011 | Lee | H01L 27/3211 257/88 |
| 2012/0086332 A1* | 4/2012 | Matsui | C09K 11/06 313/506 |
| 2012/0299472 A1* | 11/2012 | Chung | H01L 51/5271 313/504 |

(Continued)

FOREIGN PATENT DOCUMENTS

| | | |
|---|---|---|
| KR | 1020070084851 A | 8/2007 |
| KR | 1020110123009 A | 11/2011 |
| KR | 1020140073216 A | 6/2014 |

*Primary Examiner* — Christopher Raabe
(74) *Attorney, Agent, or Firm* — Cantor Colburn LLP

(57) ABSTRACT

An organic light display device includes a first substrate, light emitting structures, a second substrate and a reflective member. The first substrate includes a plurality of pixel regions, each pixel region including a plurality of sub-pixel regions, and a reflective region which surrounds the sub-pixel regions. The reflective region excludes the sub-pixel regions. The light emitting structures are respectively disposed in the sub-pixel regions on the first substrate. The second substrate is opposite to the first substrate. The reflective member is disposed in the reflective region on the lower surface of the second substrate. First openings exposing the sub-pixel regions and a second opening exposing at least a portion the reflective region are located in the reflective member.

20 Claims, 12 Drawing Sheets

(56) References Cited

U.S. PATENT DOCUMENTS

| | | | | |
|---|---|---|---|---|
| 2014/0160411 A1* | 6/2014 | Yim | ................ | G02F 1/133553 |
| | | | | 349/113 |
| 2014/0291637 A1* | 10/2014 | Yim | ................ | H01L 27/3244 |
| | | | | 257/40 |
| 2014/0299850 A1* | 10/2014 | Yim | ................ | H01L 51/5271 |
| | | | | 257/40 |
| 2014/0367646 A1* | 12/2014 | Kim | ................ | H01L 27/3246 |
| | | | | 257/40 |
| 2016/0170261 A1* | 6/2016 | Nam | ................ | G02F 1/133528 |
| | | | | 257/72 |
| 2016/0211487 A1* | 7/2016 | Choi | ................ | H01L 51/5284 |

\* cited by examiner

ORGANIC LIGHT EMITTING DISPLAY DEVICE

This application claims priority to Korean Patent Applications No. 10-2015-0023490, filed on Feb. 16, 2015, and all the benefits accruing therefrom under 35 U.S.C. § 119, the content of which in its entirety is herein incorporated by reference.

BACKGROUND

1. Field

Exemplary embodiments relate generally to display devices. More particularly, exemplary embodiments of the invention relate to organic light emitting display devices.

2. Description of the Related Art

A flat panel display ("FPD") device is widely used as a display device of an electronic device because the FPD device is relatively lightweight and thin compared to a cathode-ray tube ("CRT") display device. Typical examples of the FPD device are a liquid crystal display ("LCD") device and an organic light emitting display ("OLED") device. Compared to the LCD device, the OLED device has many advantages such as a relatively higher luminance and a wider viewing angle. In addition, the OLED device can be made relatively thinner because the OLED device does not include a separate backlight to generate and supply light. In the OLED device, electrons and holes are injected into an organic thin layer through a cathode and an anode, and then recombined in the organic thin layer to generate excitons, thereby emitting a light of a certain wavelength.

SUMMARY

One or more exemplary embodiment provides an organic light emitting display device including a reflective member capable of controlling a reflectivity of the organic light emitting display device.

According to an exemplary embodiment, an organic light display device includes a first substrate, light emitting structures, a second substrate and a reflective member. The first substrate includes a plurality of pixel regions, each pixel region including a plurality of sub-pixel regions, and a reflective region that surrounds the sub-pixel regions. The light emitting structures are respectively disposed in the sub-pixel regions of the first substrate. The second substrate is opposite to the first substrate. The reflective member is disposed on the lower surface of the second substrate. The reflective member disposed in the reflective region excluding the sub-pixel regions defines first openings exposing the sub-pixel regions and a second opening spaced apart from the first openings.

In exemplary embodiment, a size of the second opening defined in the reflective member may define a reflectivity of the reflective member.

In exemplary embodiments, the organic light display device may further include common lines disposed in the reflective region. The common lines may be electrically connected to the light emitting structures, and may overlap the reflective member which defines the first openings exposing the sub-pixel regions and the second opening spaced apart from the first openings.

In exemplary embodiments, the common lines may be a data line, a scan line or a power supply voltage line.

In exemplary embodiments, in a plan view, the second opening may be a triangular opening, a square opening, a rectangular opening, a diamond opening, a polygonal opening, a track-shaped opening, or an elliptical opening.

In exemplary embodiments, a planar size of the second opening may be less than a planar size of the first opening.

In exemplary embodiments, a planar size of the second opening may be greater than a planar size of the first opening.

In exemplary embodiments, the organic light emitting display device may further include a plurality of second openings respectively disposed in the plurality of pixel regions.

In exemplary embodiments, the first and second openings may have an arrangement in the each pixel region, and the arrangements of the first and second openings may be the same among the plurality of pixel regions.

In exemplary embodiments, the first and second openings may have an arrangement in the each pixel region, the arrangements of the first openings may be the same among the plurality of pixel regions, and the arrangements of the second openings may be different among the plurality of pixel regions.

In exemplary embodiments, among the plurality of pixel regions, the second openings may have the same shape as each other.

In exemplary embodiments, among the plurality of pixel regions, the second openings may have different shapes from each other.

In exemplary embodiments, among the plurality of pixel regions, the second opening may be located in the reflective region of at least one of two adjacent pixel regions.

In exemplary embodiments, the second openings may have an arrangement in the each pixel region, and the arrangements of the second openings may be the same among the plurality of pixel regions.

In exemplary embodiments, the second openings may have an arrangement in the each pixel region, and the arrangements of the second openings may be different among the plurality of pixel regions.

In exemplary embodiments, the first substrate may further include a transparent region defined in the reflective region, the transparent region excluding a remainder of the reflective region. The second opening defined by the reflective member may expose the transparent region.

In exemplary embodiments, the organic light emitting display device may further include common lines disposed in the reflective region. The common lines may be electrically connected to the light emitting structures, and may overlap the reflective member which defines the first openings exposing the sub-pixel regions and the second opening spaced apart from the first openings.

In exemplary embodiments, a planar area of the transparent region may be greater than a planar area of the reflective region.

In exemplary embodiments, the transparent region excluding the remainder of the reflective region may transmit therethrough an image of an object located at the first substrate side of the organic light emitting display device.

In exemplary embodiments, each of the light emitting structures may include a semiconductor element, a lower electrode, a pixel defining layer and an upper electrode. The semiconductor element may be disposed on the first substrate. The lower electrode may be disposed on the semiconductor element, and may be electrically connected to the semiconductor element. The pixel defining layer may expose at least a portion the lower electrode. The light emitting layer may be disposed on the exposed lower electrode. The upper electrode may be disposed on the light emitting layer.

One or more exemplary embodiment of an organic light emitting display device according to the invention includes a reflective member which defines an opening to control a reflectivity of the reflective member, such that a visibility of an image displayed by the organic light emitting display device may be increased.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
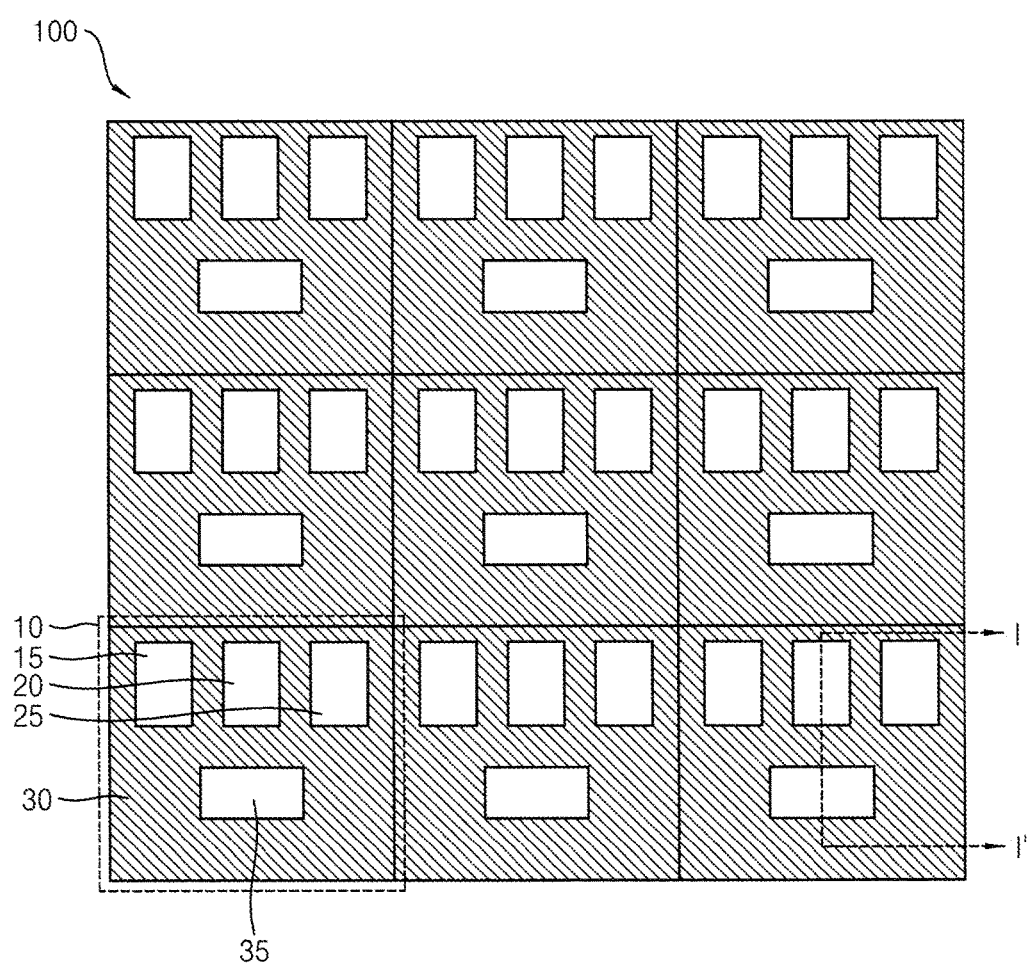
FIG. 1 is a planar view illustrating an exemplary embodiment of an organic light emitting display device in accordance with the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A mirror organic light emitting display ("OLED") device capable of reflecting an image of an object (or target) that is located in the front of the OLED device, by including a reflective member therein, has been developed. In the mirror OLED, when a relatively large amount of an external light is reflected from the reflective member therein (e.g., an illumination of an external environment is high), a contrast of an image that is displayed by the mirror OLED device may be decreased because the reflective member includes or is formed of a material of which a reflectivity is relatively high (e.g., a metal). Accordingly, a visibility of the image displayed by the mirror OLED device in a high illumination external environment may be reduced.

Hereinafter, exemplary embodiments of the invention will be explained in detail with reference to the accompanying drawings.

FIG. 1 is a planar view illustrating an exemplary embodiment of an OLED device in accordance with the invention.

Referring to FIG. 1, an OLED device 100 may include a plurality of pixel regions defined therein. First through third sub-pixel regions and a reflective region 30 may be located in one pixel region 10. Here, a reflective member may be disposed in the reflective region 30, and the reflective member may define first openings 15, 20 and 25 and a second opening 35 therein. The first openings 15, 20 and 25 may expose the first through third sub-pixel regions. In an exemplary embodiment, for example, each of the first openings 15, 20 and 25 may be located in the first through third sub-pixel regions, respectively. Thus, the reflective region 30 may substantially surround the first through third sub-pixel regions. The reflective region 30 of the pixel region 10 may be considered as a remainder of the pixel region 10 excluding the first through third sub-pixel regions.

Each of first through third pixels may be disposed in the first through third sub-pixel regions, respectively. In an exemplary embodiment, for example, the first pixel may be a pixel emitting a red color. The second pixel may be a pixel emitting a green color. The third pixel may be a pixel emitting a blue color. The first through third pixels may be disposed on a first substrate, and may be located in a same layer of the OLED device 100 among layers disposed on the first substrate (e.g., at the same level). In exemplary embodiments, a planar shape of the first through third sub-pixel regions may be the same as that of the first openings 15, 20 and 25.

The reflective member, common lines (e.g., data lines, scan lines, power supply voltage lines, etc.), and insulation layers (e.g., a pixel defining layer, a protection layer, etc.) may be disposed in the reflective region 30. Here, the common lines may be electrically connected to the first through third sub-pixels. The reflective member, the common lines and the insulation layers may be substantially disposed at different layers from each other among layers disposed on the first substrate (e.g., at different levels from each other). In an exemplary embodiment, for example, the insulation layer may be disposed on (e.g. above) the first substrate, and the pixel defining layer may be disposed on (e.g., above) the insulation layer. The pixel defining layer may substantially surround the first through third sub-pixels, and an upper electrode may be disposed on the pixel defining layer and on the first through third sub-pixels.

A second substrate may be disposed on and facing the upper electrode. Here, the reflective member may be disposed in the reflective region 30 on a lower surface of the second substrate. In exemplary embodiments, a planar shape of the reflective region 30 may be the same as that of the reflective member. In an exemplary embodiment, the shape of the reflective region 30 may include an area of the second opening defined by the reflective member. The second opening 35 may expose a portion of the upper electrode. In addition, the common lines may overlap the reflective member. The common lines may not be disposed in a portion at which the second opening 35 is located. Further, a shape of the second opening 35 may be changed depending on an arrangement of the common lines. In an exemplary embodiment, for example, in a top plan view, the second opening 35 may be a planar shape triangular opening, a square opening, a rectangular opening, a diamond opening, a polygonal opening, a track-shaped opening or an elliptical opening.

The reflective member may reflect an external light incident thereto. When a relatively large amount of an external light is reflected from the reflective member, a reflectivity of the OLED device 100 may be increased, however, a contrast of an image displayed by the OLED device 100 may be decreased. To decrease a reflectivity of the OLED device 100, the OLED device 100 may include the reflective member having the second opening 35 defined therein, and an amount of the external light reflected from the reflective member may be reduced. Thus, the overall reflectivity of the OLED device 100 may be decreased to thereby increase a contrast of an image displayed by the OLED device 100. In exemplary embodiments, a reflectivity of the reflective member may be controlled according to a size of the second opening 35.

Figure 2:
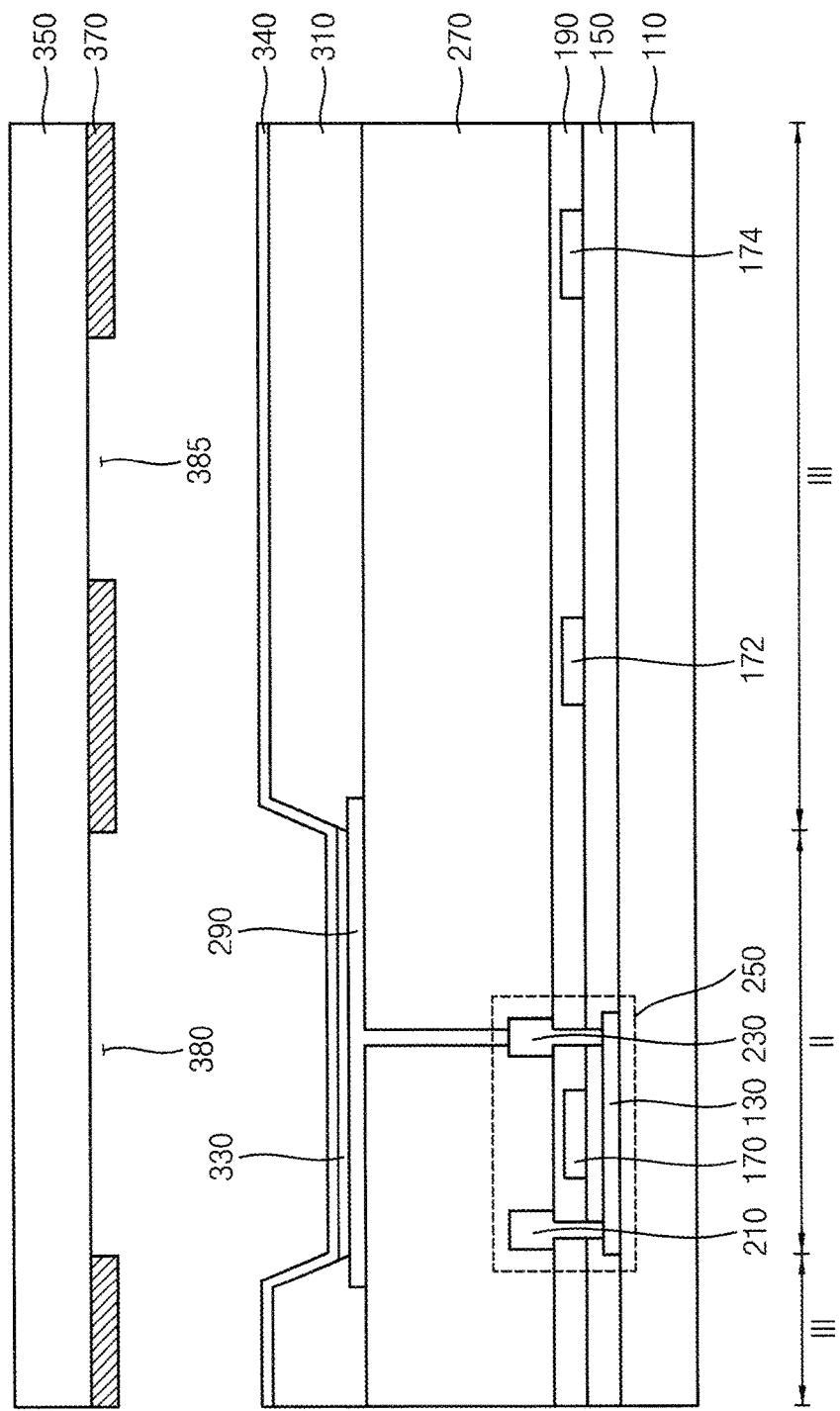
FIG. 2 is a cross-sectional view of the organic light emitting display device taken along line I-I' of FIG. 1.

FIG. 2 is a cross-sectional view illustrating the OLED device taken along line I-I' of FIG. 1.

Referring to FIG. 2, the OLED device 100 may include a first substrate 110, a first insulation layer 150, a second insulation layer 190, a third insulation layer 270, common lines 172 and 174, a light emitting structure, a pixel defining layer 310, a reflective member 370, a second substrate 350, etc. Here, the light emitting structure may include a semiconductor element 250, a lower electrode 290, a light emitting layer 330 and an upper electrode 340. The semiconductor element 250 may include an active layer 130, a gate electrode 170, a source electrode 210 and a drain electrode 230. The reflective member 370 may have a first opening 380 and a second opening 385 defined therein.

As described above, the OLED device 100 may include a plurality of pixel regions 10. The one pixel region may include a sub-pixel region II and a reflective region III. The reflective region III may substantially surround the sub-pixel region II, and a planar shape of the reflective region III may be the substantially same as that of the reflective member 370. The reflective region III may be a remainder of the one pixel region excluding the sub-pixel region II. The semiconductor element 250, the lower electrode 290, the light emitting layer 330 and a portion of the upper electrode 340 of the light emitting structure may be disposed in the sub-pixel region II. The sub-pixel region II may be considered a transmissive or display region of the pixel region 10 at which an image generated by the OLED device 100 is displayed. In addition, the reflective member 370 and the common lines 172 and 174 may be disposed in the reflective region III.

In an exemplary embodiment, for example, an image may be displayed in the sub-pixel region II. An image of an object that is located in the front of the OLED device 100 may be reflected in the reflective region III. A reflectivity of the reflective member 370 may be controlled depending on a size of the second opening 385 defined therein. As the OLED device 100 includes a reflective member 370 defining the second opening 385 therein, the OLED device 100 may serve as a mirror display device in which the reflectivity thereof is controlled.

The light emitting structure may be disposed on the first substrate 110. The first substrate 110 may include or be formed of a transparent material. In an exemplary embodiment, for example, the first substrate 110 may include quartz, synthetic quartz, calcium fluoride, fluoride-doping quartz, a soda lime glass, a non-alkali glass etc.

Alternatively, the first substrate 110 may include or be formed of a flexible transparent material such as a flexible transparent resin substrate. Here, the flexible transparent resin substrate for the first substrate 110 may include a polyimide substrate. In an exemplary embodiment, for example, the polyimide substrate may include a first polyimide layer, a barrier film layer, a second polyimide layer, etc. When the polyimide substrate is relatively thin and flexible, the polyimide substrate may be disposed or formed on a rigid glass substrate to help support the formation of the light emitting structure. That is, in exemplary embodiments, the first substrate 110 may have a structure in which the first polyimide layer, the barrier film layer and the second polyimide layer are stacked on the rigid glass substrate.

In an exemplary embodiment of manufacturing the OLED device 100, after an insulation layer is provided on the second polyimide layer of the polyimide substrate, the light emitting structure (e.g., the semiconductor element 250, a capacitor, the lower electrode 290, the light emitting layer 330, the upper electrode 340, etc.) may be disposed on the insulation layer. After the light emitting structure is formed on the insulation layer, the rigid glass substrate under which the polyimide substrate is disposed may be removed. It may be difficult to directly form the light emitting structure on the polyimide substrate because the polyimide substrate is relatively thin and flexible. Accordingly, the light emitting structure is formed on the polyimide substrate and the rigid glass substrate, and then the polyimide substrate may serve as the first substrate 110 of the OLED device 100 after the removal of the rigid glass substrate. As the OLED device 100 includes the sub-pixel region II and the reflective region III, the first substrate 110 may also include the sub-pixel region II and the reflective region III.

A buffer layer (not shown) may be disposed on the first substrate 110 to be between the substrate and other layers of the OLED device 100 disposed on the substrate 100. The buffer layer may extend from the sub-pixel region II into the reflective region III. The buffer layer may reduce or effectively prevent the diffusion (e.g., an out gassing) of metal atoms and/or impurities from the first substrate 110. Additionally, in an exemplary embodiment of manufacturing the OLED device 100 the buffer layer may control a rate of heat transfer in a crystallization process for forming the active layer 130, thereby obtaining a substantially uniform active layer 130. Furthermore, the buffer layer may improve a surface flatness of the first substrate 110 within the OLED device 100 when a surface of the first substrate 110 is relatively irregular. According to a type of the first substrate 110, at least two buffer layers may be provided on the first substrate 110, or the buffer layer may not be disposed on the first substrate 110.

The semiconductor element 250 may include the active layer 130, the gate electrode 170, the source electrode 210 and the drain electrode 230. In an exemplary embodiment, for example, the active layer 130 may be disposed on the first substrate 110. The active layer 130 may include or be formed an oxide semiconductor, an inorganic semiconductor (e.g., amorphous silicon, polysilicon, etc.), an organic semiconductor, etc.

The first insulation layer 150 may be disposed on the active layer 130. The first insulation layer 150 may cover the active layer 130 in the sub-pixel region II, and may extend in a first direction on the first substrate 110. That is, the first insulation layer 150 may be disposed on an entirety of the first substrate 110. The first insulation layer 150 may include or be formed a silicon compound, a metal oxide, etc.

The gate electrode 170 may be disposed on a portion of the first insulation layer 150 under which the active layer 130 is located, to overlap the active layer 130. The gate electrode 170 may include or be formed of a metal, an alloy, metal nitride, conductive metal oxide, transparent conductive materials, etc.

The common lines 172 and 174 may be disposed on the first insulation layer 150. The common lines 172 and 174 may be spaced apart from the gate electrode 170, and may overlap portions of the reflective member 370 which define an opening therein. In an exemplary embodiment, for example, the common lines 172 and 174 may not overlap the second opening 385 defined by the reflective member 370 disposed in the reflective region III.

In a conventional OLED device, when the common lines 172 and 174 are exposed by (e.g., overlap) the second opening 385 defined by the reflective member 370, an external light that is incident to the common lines 172 and 174 may be reflected from the common lines 172 and 174 to travel toward the front of the OLED device via the second opening 385 defined by the reflective member 370. When the external light is reflected from the common lines 172 and 174, a visibility of the OLED device 100 may be reduced. Thus, to reduce or effectively prevent this in one or more exemplary embodiment of the invention, the common lines 172 and 174 may not be disposed in a portion at which the second opening 385 is located.

The common lines 172 and 174 and the gate electrode 170 may include substantially the same material, and in an exemplary embodiment of manufacturing the OLED device 100, the common lines 172 and 174 and the gate electrode 170 may be simultaneously formed. Alternatively, the common lines 172 and 174 may be disposed on the first substrate 110 (i.e., under the first insulation layer 150) or on the second insulation layer 190 (e.g., above the second insulation layer 190). When the common lines 172 and 174 are disposed on the first substrate 110 such as between the first substrate 110 and the first insulation layer 150, the common lines 172 and 174 and the active layer 130 may include substantially the same material, and in an exemplary embodiment of manufacturing the OLED device 100, the common lines 172 and 174 and the active layer 130 may be simultaneously formed. In addition, when the common lines 172 and 174 are disposed on the second insulation layer 190, the common lines 172 and 174, the source electrode 210 and the drain electrode 230 may include substantially the same material, and in an exemplary embodiment of manufacturing the OLED device 100, the common lines 172 and 174, the source electrode 210 and the drain electrode 230 may be simultaneously formed.

The second insulation layer 190 may be disposed on the gate electrode 170. The second insulation layer 190 may cover the gate electrode 170 in the sub-pixel region II, and may extend in the first direction on the first substrate 110. That is, the second insulation layer 190 may be disposed on the entirety of the first substrate 110. The second insulation layer 190 may include or be formed of a silicon compound, a metal oxide, etc.

The source electrode 210 and the drain electrode 230 may be disposed on the second insulation layer 190. The source electrode 210 may be in contact with a first side of the active layer 130 by an opening defined in the first and second insulation layers 150 and 190. The drain electrode 230 may be in contact with a second side of the active layer 130 opposite to the first side by an opening defined in the first and second insulation layers 150 and 190. Each of the source electrode 210 and the drain electrode 230 may include or be formed of a metal, an alloy, metal nitride, conductive metal oxide, transparent conductive materials, etc.

The third insulation layer 270 may be disposed on the source electrode 210 and the drain electrode 230. The third insulation layer 270 may cover the source electrode 210 and the drain electrode 230 in the sub-pixel region II, and may extend in the first direction on the first substrate 110. That is, the third insulation layer 270 may be disposed on the entirety of the first substrate 110. The third insulation layer 270 may include be formed of a silicon compound, a metal oxide, etc.

The lower electrode 290 may be disposed on the third insulation layer 270. The lower electrode 290 may be in contact with the source electrode 210 by an opening defined in the third insulation layer 270. In addition, the lower electrode 290 may be electrically connected to the semiconductor element 250 via an electrode of the semiconductor element 250. The lower electrode 290 may include or be formed of a metal, an alloy, metal nitride, conductive metal oxide, transparent conductive materials, etc.

The pixel defining layer 310 may be disposed the on third insulation layer 270. Portions of the pixel defining layer 310 define an opening to expose a portion of the lower electrode 290. The pixel defining layer 310 may include or be formed of an organic material and/or an inorganic material. The light emitting layer 330 may be disposed on a portion of the lower electrode 290 which is exposed by the pixel defining layer 310.

The light emitting layer 330 may be disposed on the exposed lower electrode 290. The light emitting layer 330 may include or be formed using a light emitting material capable of generating different colors of light (e.g., a red color of light, a blue color of light, and a green color of light) according to the first through third sub-pixels illustrated in FIG. 1 in which the light emitting layer 330 is disposed.

The upper electrode 340 may be disposed on the pixel defining layer 310 and on the light emitting layer 330. The upper electrode 340 may cover the pixel defining layer 310 and the light emitting layer 330 in both the sub-pixel region II and the reflective region III, and may extend in the first direction on the first substrate 110. That is, the upper electrode 340 may be electrically connected to the first through third pixels. The upper electrode 340 may include or be formed of a metal, an alloy, metal nitride, conductive metal oxide, a transparent conductive material, etc. These materials may be used alone or in a combination thereof.

The reflective member 370 may be disposed on the upper electrode 340. The reflective member 370 may be disposed in the reflective region III on a lower surface of the second substrate 350. A planar shape of the reflective member 370 may be the substantially same as that of the reflective region III. A first surface of the reflective member 370 may face the upper electrode 340, and a second surface of the reflective member 370 may be opposite to the upper electrode 340 such as being in contact with the second substrate 350. The external light from the front of the OLED device 100 that is transmitted through the second substrate 350 may be incident on the second surface of reflective member 370 and reflected from the second surface of reflective member 370. In an exemplary embodiment, for example, an image of an object that is located in the front of the OLED device 100 may be displayed on the second surface of the reflective member 370.

In addition, the reflective member 370 having a plate-shape, may define the first opening 380 and the second opening 385 therein. The first opening 380 may be located in the sub-pixel region II, and the second opening 385 may be located in the reflective region III. The first opening 380 may expose the sub-pixel region II, and a size of the first opening 380 may be the substantially same as that of the sub-pixel region II. A light emitted from the light emitting layer 330 of the OLED device 100 may travel through the first opening 380 that is located in the sub-pixel region II and to the front of the OLED device 100.

In addition, a shape of the second opening 385 may be controlled depending on an arrangement of the common lines 172 and 174. In an exemplary embodiment, for example, the second opening 385 may be a triangular opening, a square opening, a rectangular opening, a diamond opening, a polygonal opening, a track-shaped opening, or an elliptical opening.

In exemplary embodiments, one or more of the first openings 380 that are respectively arranged in a plurality of the pixel regions 10 may be regularly arranged within an individual pixel region 10, that is, having a uniform space therebetween. The one or more of the first openings 380 that are respectively arranged in the plurality of the pixel regions 10 may be in regularly arranged considering the arrangements among the plurality of the pixel regions 10, that is, in a substantially same arrangement or position from pixel region 10 to pixel region 10. One or more of the second openings 385 that are respectively arranged in a plurality of the pixel regions 10 may also be regularly arranged considering the arrangements among the plurality of the pixel regions 10, that is, in a substantially same arrangement or position from pixel region 10 to pixel region 10. In addition, the second openings 385 that are respectively arranged in a plurality of the pixel regions 10 may have the substantially same shape to each other from pixel region 10 to pixel region 10. A planar size of the second opening 385 may be less than that of the first opening 380. Alternatively, a planar size of the second opening 385 may be greater than that of the first opening 380.

In some exemplary embodiments, the first openings 380 that are arranged in a plurality of the pixel regions may be regularly arranged as described above, and the second openings 385 that are arranged in a plurality of the pixel regions 10 may be irregularly arranged, that is, in a different arrangement or position from pixel region 10 to pixel region 10. In addition, the second openings 385 that are arranged in a plurality of the pixel regions may have the substantially same shape to each other from pixel region 10 to pixel region 10. A planar size of the second opening 385 may be less than that of the first opening 380. Alternatively, a planar size of the second opening 385 may be greater than that of the first opening 380. Further, a reflectivity of the reflective member 370 is controlled depending on a size of the second opening 385.

In an exemplary embodiment, for example, when an OLED device is positioned in a place for which an illumination of an external environment is relatively high, a relatively large amount of an external light may be reflected from the reflective member. Where a relatively large amount of an external light is reflected from the reflective member, an image of an object that is located in the front of the OLED device is reflected from the reflective member, and an illumination of the image may be relatively high. Where an illumination of the reflected image is high, a contrast of an image that is displayed by the OLED device may be relatively decreased. As a result, a visibility of the displayed image may be undesirably reduced. Thus, in one or more exemplary embodiment of the OLED device 100 according to the invention, a planar size of the second opening 385 of the reflective member 370 may be changed depending on a place or environment in which the OLED device 100 is used. In an exemplary embodiment, for example, when the OLED device 100 is used in a relatively bright place, a size of the second opening 385 may be relatively largely manufactured, and thus a planar area of the reflective member 370 capable of reflecting the external light may be decreased. Accordingly, a reflectivity of the reflective member 370 may be decreased, and the contrast of the displayed image may be relatively increased.

In contrast, when an OLED device is positioned in a place for which an illumination of an external environment is relatively low, a relatively small amount of an external light may be reflected from the reflective member. Where a relatively small amount of an external light is reflected from the reflective member, an image of an object that is located in the front of the OLED device is still reflected from the reflective member. However, since the amount of reflected external light is low, a visibility of the reflected image may be reduced. Thus, when one or more exemplary embodiment of the OLED device 100 according to the invention is used in a relatively dark or low-light place or environment, a size of the second opening 385 may be relatively small, and thus an area of the reflective member 370 capable of reflecting the external light may be increased. Accordingly, a reflectivity of the reflective member 370 may be increased, and the visibility of the reflected image may be relatively increased.

The reflective member 370 may include or be formed of materials for which a reflectivity thereof is relatively high. In an exemplary embodiment, for example, the reflective member 370 may include gold (Au), silver (Ag), aluminum (Al), magnesium (Mg), platinum (Pt), Nickel (Ni), titanium (Ti), etc. Alternatively, the reflective member 370 may include or be formed of an alloy, metal nitride, conductive metal oxide, etc. In an exemplary embodiment, for example, the reflective member 370 may include an alloy of aluminum, aluminum nitride (AlNx), an alloy of silver, tungsten nitride (WNx), an alloy of copper, chrome nitride (CrNx), an alloy of molybdenum, titanium nitride (TiNx), tantalum nitride (TaNx), strontium ruthenium oxide (SRO), zinc oxide (ZnOx), stannum oxide (SnOx), indium oxide (InOx), gallium oxide (GaOx), etc.

The second substrate 350 may be disposed over the reflective member 370 at the front side of the OLED device 100. The second substrate 350 and the first substrate 110 may include substantially the same materials. In an exemplary embodiment, for example, the second substrate 350 may include or be formed of quartz, synthetic quartz, calcium fluoride, fluoride-doping quartz, soda lime glass, non-alkali glass etc. In some exemplary embodiments, the second substrate 350 may include or be formed of a transparent inorganic material or a flexible plastic. In an exemplary embodiment, for example, the second substrate 350 may include a flexible transparent resin substrate. Where the second substrate 350 includes a flexible transparent resin substrate, to increase flexibility of the OLED device 100, the second substrate 350 may include a stacked structure where at least one organic layer and at least one inorganic layer are alternately stacked.

One or more exemplary embodiment of the OLED device 100 in accordance with the invention includes the reflective member 370 defining the second opening 385 therein. Accordingly, the OLED device 100 may serve as a mirror display device in which a reflectivity of the reflective member 370 therein is controlled. In addition, as the OLED device 100 is manufactured by changing a size of the second opening 385 defined in the reflective member 370 depending on a place or environment in which the OLED device 100 is used, the OLED device 100 may be used in various places and environments. Further, a visibility of images displayed by the OLED device 100 may be increased.

FIGS. 3 through 7 are cross sectional views illustrating an exemplary embodiment of a method of manufacturing an OLED device in accordance with the invention.

Figure 3:
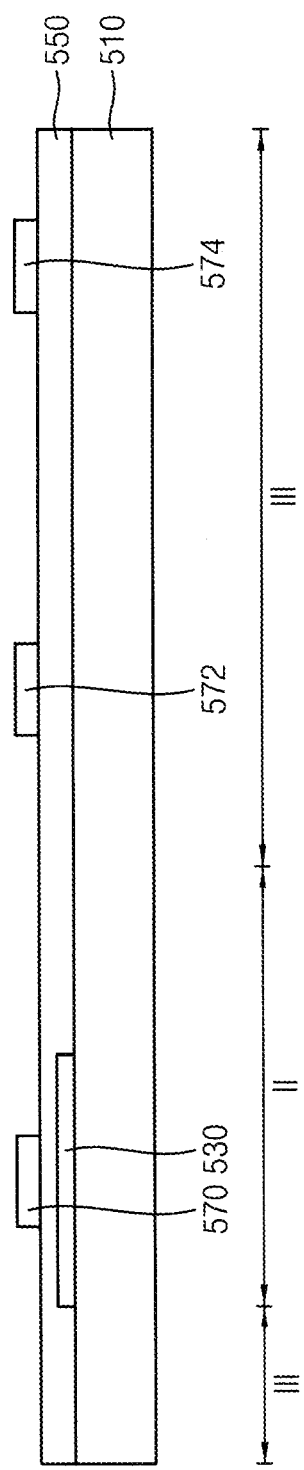
FIGS. 3 through 7 are cross-sectional views illustrating an exemplary embodiment of a method of manufacturing an organic light emitting display device in accordance with the invention.

Referring to FIG. 3, an active layer 530 may be formed in a sub-pixel region II of a first substrate 510. The first substrate 510 may be formed using quartz, synthetic quartz, calcium fluoride, fluoride-doping quartz, a soda lime glass, a non-alkali glass etc. Alternately, a buffer layer may be formed on the first substrate 510 before forming the active layer 530. The buffer layer may extend in a first direction from the sub-pixel region II into a reflective region III on the first substrate 510. That is, the buffer layer may be formed on the entirety of the first substrate 510. The buffer layer may reduce or effectively prevent the diffusion of metal atoms and/or impurities from the first substrate 510. The active layer 530 may be formed in the sub-pixel region II on the first substrate 510, and may be formed using an oxide semiconductor, an inorganic semiconductor, an organic semiconductor, etc.

A first insulation layer 550 may be formed on the active layer 530 and the first substrate 510. The first insulation layer 550 may cover the active layer 530, and may extend in the first direction on the first substrate 510. The first insulation layer 550 may be formed in the sub-pixel region II and the reflective region III to be disposed on the entirety of the first substrate 510. The first insulation layer 550 may be formed using a silicon compound, a metal oxide, etc.

A gate electrode 570 and common lines 572 and 574 may be formed on the first insulation layer 550. The common lines 572 and 574 may be spaced apart from the gate electrode 570. The gate electrode 570 may be formed on a portion under which the active layer 530 is located. Each of the gate electrode 570 and the common lines 572 and 574 may be formed using a metal, an alloy, metal nitride, conductive metal oxide, transparent conductive materials, etc. The gate electrode 570 and the common lines 572 and 574 may include substantially the same materials, and may be simultaneously formed on the first insulation layer 550 in a same layer of the OLED device among layers disposed on the first substrate 510.

Figure 4:
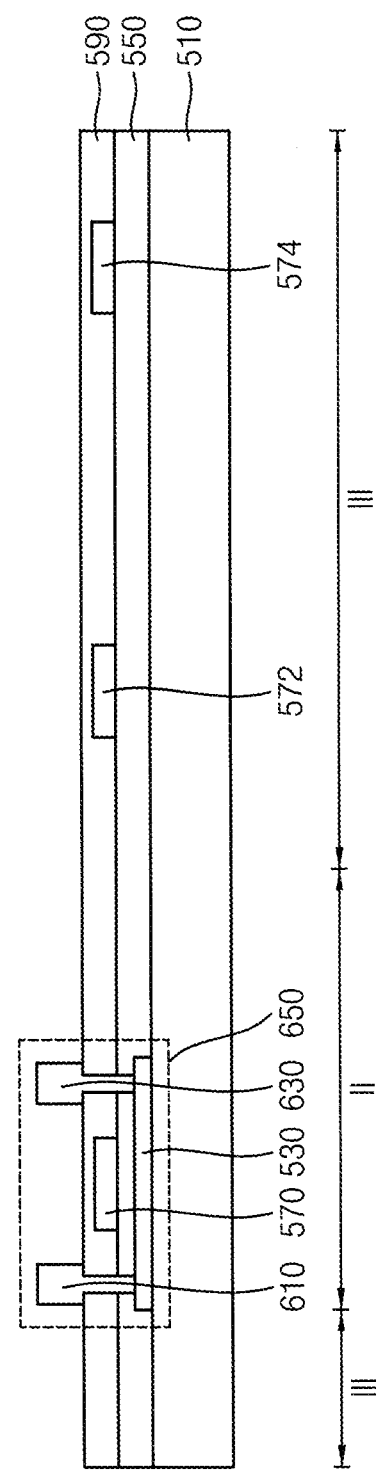

Referring to FIG. 4, a second insulation layer 590 may be formed on the gate electrode 570. The second insulation layer 590 may cover the gate electrode 570 and the common lines 572 and 574, and may extend in the first direction on the first insulation layer 550. The second insulation layer 590 may be formed in the sub-pixel region II and the reflective region III on the entirety of the first substrate 510. The second insulation layer 590 may be formed using a silicon compound, a metal oxide, etc. A source electrode 610 and a drain electrode 630 may be formed on the second insulation layer 590.

The source electrode 610 may be contacted to a first side of the active layer 530 by removing a first portion of the first and second insulation layers 550 and 590, and the drain electrode 630 may be contacted to a second side of the active layer 530 opposite to the first side thereof by removing a second portion of the first and second insulation layers 550 and 590. Each of the source electrode 610 and the drain electrode 630 may be formed using a metal, an alloy, metal nitride, conductive metal oxide, transparent conductive materials, etc. These may be used alone or in a combination thereof. In this way, a semiconductor element 650 having the source electrode 610, the drain electrode 630, the gate electrode 570 and the active layer 530 may be formed.

Figure 5:
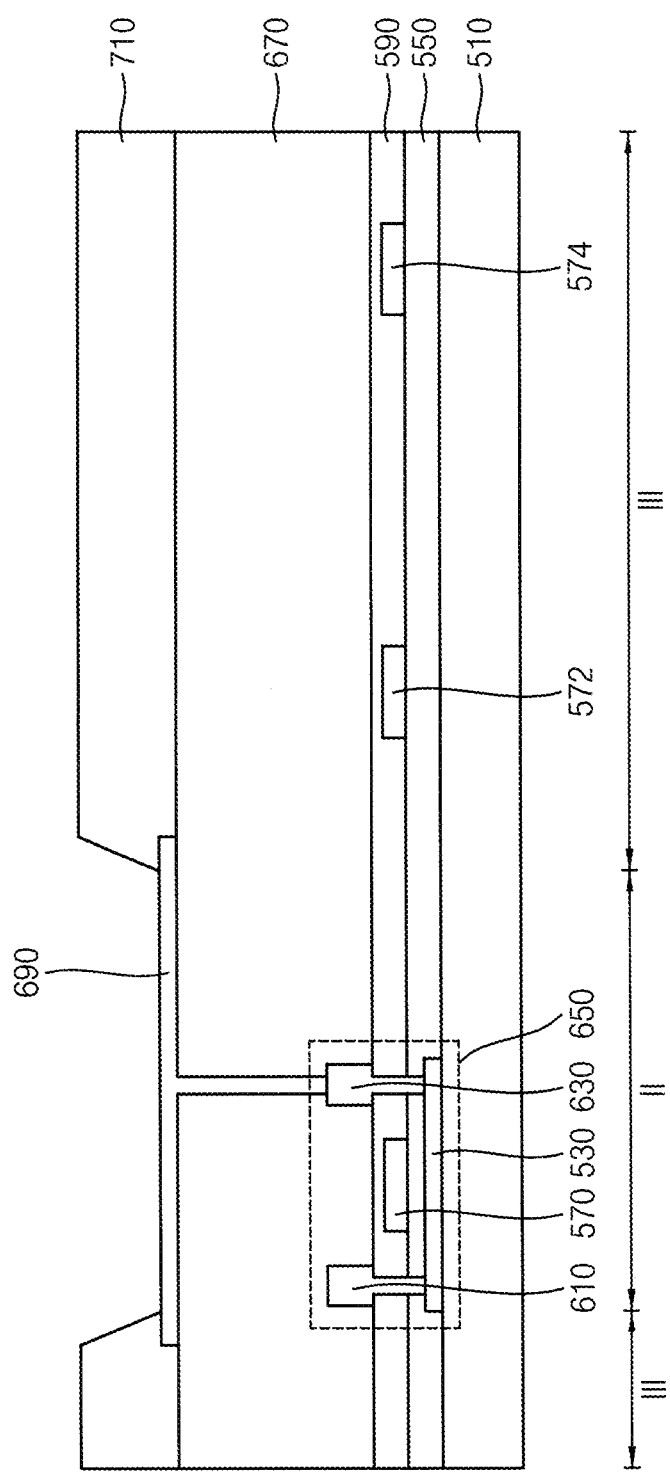

Referring to FIG. 5, a third insulation layer 670 may be formed on the second insulation layer 590. The third insulation layer 670 may cover the source electrode 610 and the drain electrode 630, and may extend in the first direction on the second insulation layer 590. The third insulation layer 670 may be formed in the sub-pixel region II and the reflective region III on the entirety of the first substrate 510. The third insulation layer 670 may be formed using a silicon compound, a metal oxide, etc.

A lower electrode 690 may be formed on a third insulation layer 670. The lower electrode 690 may be contacted to the drain electrode 630 by removing a portion of the third insulation layer 670. The lower electrode 690 may be formed using a metal, an alloy, metal nitride, conductive metal oxide, transparent conductive materials, etc.

A pixel defining layer 710 may be formed on a portion of third insulation layer 670 and a portion of the lower electrode 690. The pixel defining layer 710 may be formed the on third insulation layer 670 to expose a portion of the lower electrode 690. The pixel defining layer 710 may be formed using an organic material and/or an inorganic material.

Figure 6:
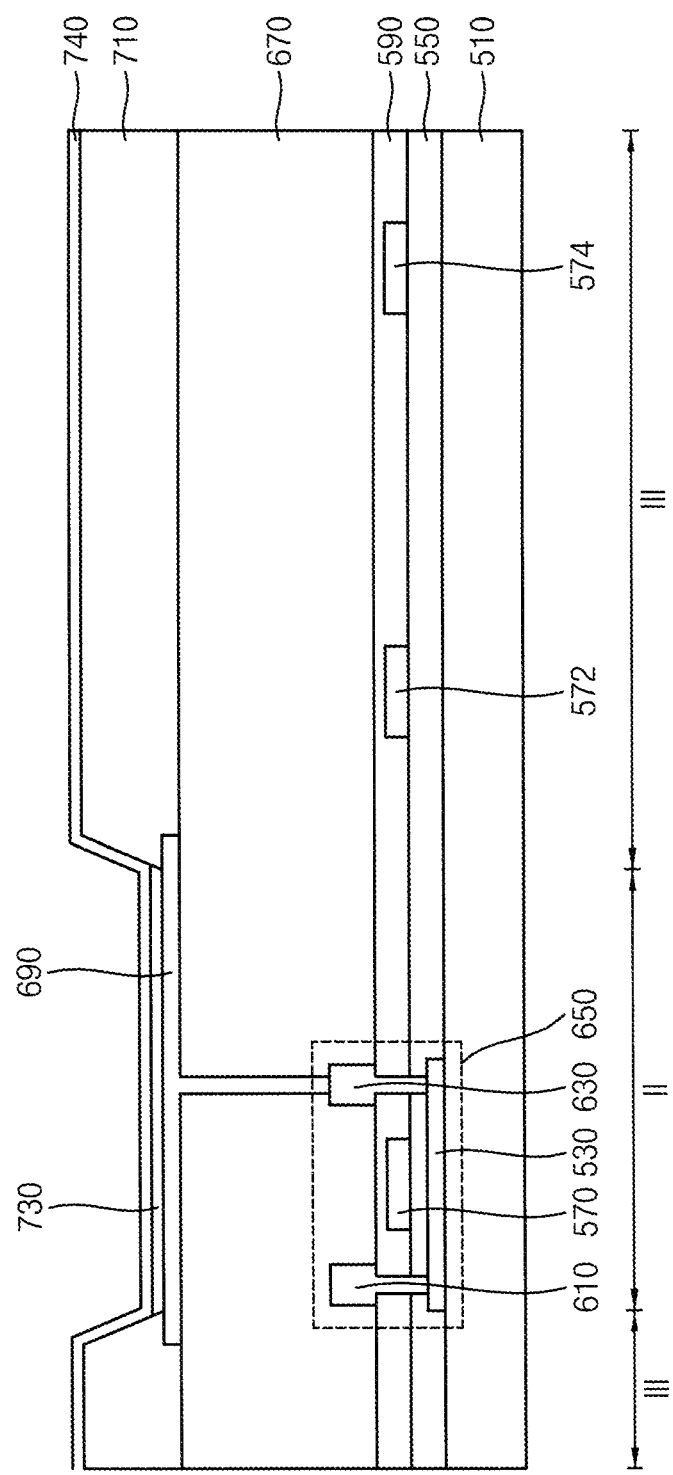

Referring to FIG. 6, a light emitting layer 730 may be formed on the exposed lower electrode 690. The light emitting layer 730 may be formed using at least one among light emitting materials capable of generating different colors of light according to the first through third sub-pixels illustrated in FIG. 1 in which the light emitting layer 730 is disposed. In the sub-pixel region II, a second opening is located. An upper electrode 740 may be formed on the pixel defining layer 710 and on the light emitting layer 730. The upper electrode 740 may cover the pixel defining layer 710 and the light emitting layer 730, and may extend in the first direction on the pixel defining layer 710 and the light emitting layer 730. The upper electrode 740 may be formed using a metal, an alloy, metal nitride, conductive metal oxide, a transparent conductive material, etc. These materials may be used alone or in a combination thereof.

Figure 7:
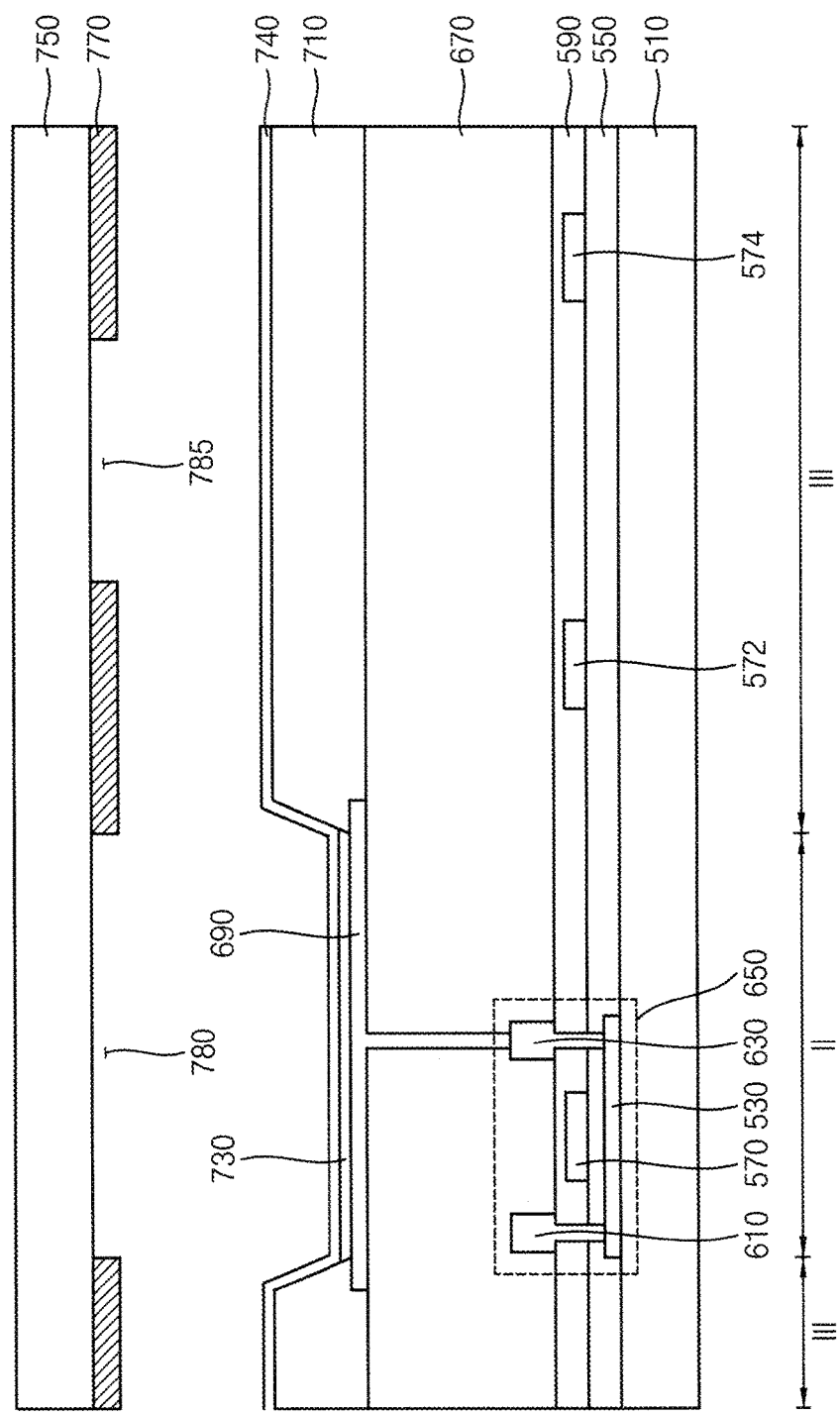

Referring to FIG. 7, a second substrate 750 may be provided. The second substrate 750 and the first substrate 510 may be formed of substantially the same materials. In an exemplary embodiment, for example, the second substrate 750 may be formed using quartz, synthetic quartz, calcium fluoride, fluoride-doping quartz, soda lime glass, non-alkali glass etc. In some exemplary embodiments, the second substrate 750 may be formed using a transparent inorganic material or a flexible plastic. In an exemplary embodiment, for example, the second substrate 750 may include a flexible transparent resin substrate. Where the second substrate 750 includes a flexible transparent resin substrate, to increase flexibility of an OLED device, the second substrate 750 may include a stacked structure where at least one organic layer and at least one inorganic layer are alternately stacked.

The reflective member 770 may be formed in the reflective region III on a lower surface of the second substrate 750. An overall shape of the reflective member 770 may be the substantially same as that of the reflective region III. A first surface of the reflective member 770 may face the upper electrode 740, and a second surface of the reflective member 770 may be in contact with the second substrate 750. An external light that is transmitted through the second substrate 750 and incident to the second surface of the reflective member 770 may be reflected from the second surface of reflective member 770 to a front side of the OLED device. In an exemplary embodiment, for example, an image of an object that is located in the front of the OLED device may be displayed on the second surface of the reflective member 770.

In addition, the reflective member 770 having a plate-shape, may define a first opening 780 and a second opening 785 therein. The first opening 780 may be located in the sub-pixel region II, and the second opening 785 may be located in the reflective region III. That is, the overall reflective region III may include an area in which the second opening 785 is disposed in addition to an area in which the reflective member 770 is disposed. The first opening 780 may expose the sub-pixel region II, and a size of the first opening 780 may be the substantially same as that of the sub-pixel region II. A light emitted from the light emitting layer 730 of the OLED device may travel through the first opening 780 that is located in the sub-pixel region II and to the front of the OLED device.

In addition, a shape of the second opening 385 may be controlled depending on an arrangement of the common lines 572 and 574. In an exemplary embodiment, for example, the second opening 785 may be a triangular opening, a square opening, a rectangular opening, a diamond opening, a polygonal opening, a track-shaped opening, or an elliptical opening.

Further, a reflectivity of the reflective member 770 is controlled depending on a size of the second opening 785 defined therein. The reflective member 770 may be formed of materials for which a reflectivity thereof is relatively high. In an exemplary embodiment, for example, the reflective member 770 may be formed using Au, Ag, Al, Mg, Pt, Ni, Ti, etc. Alternatively, the reflective member 770 may be formed of an alloy, metal nitride, conductive metal oxide, etc. In an exemplary embodiment, for example, the reflective member 770 may include an alloy of aluminum, AlNx, an alloy of silver, WNx, an alloy of copper, CrNx, an alloy of molybdenum, TiNx, TaNx, SRO, ZnOx, SnOx, InOx, GaOx, etc.

Referring again to FIG. 2, the second substrate 750 on which the reflective member 770 is formed may be disposed on the upper electrode 740 such as by performing an encapsulation process to complete the OLED device.

Figure 8:
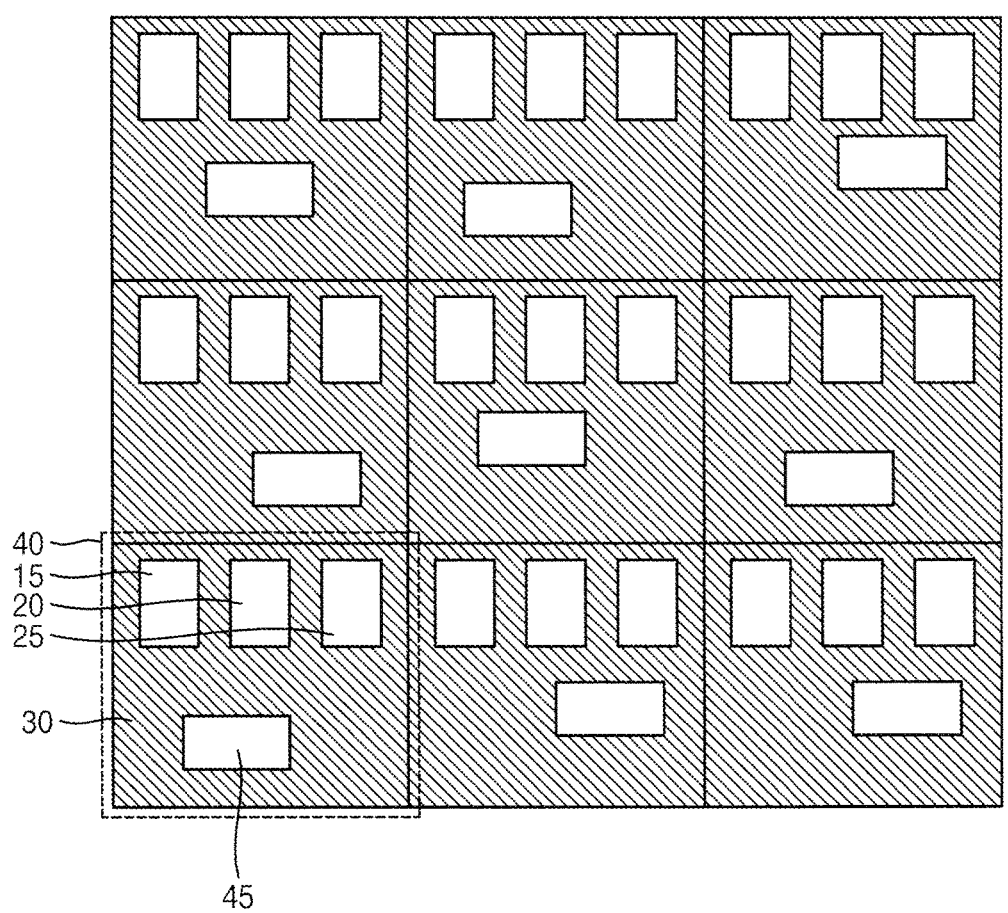
FIG. 8 is a planar view illustrating another exemplary embodiment of an organic light emitting display device in accordance with the invention.

FIG. 8 is a planar view illustrating another exemplary embodiment of an OLED device in accordance with the invention. An OLED device illustrated in FIG. 8 may have a configuration substantially the same as or similar to that of an OLED device 100 described with reference to FIG. 1 except an arrangement of second openings 45 among a plurality of pixel regions 40. In FIG. 8, detailed descriptions for elements, which are substantially the same as or similar to the elements described with reference to FIG. 1, will be omitted.

Referring to FIG. 8, an OLED device may include a plurality of pixel regions defined therein. First through third sub-pixel regions and a reflective region 30 may be located in one pixel region 40. Here, a reflective member may be disposed in the reflective region 30, and the reflective member may define first openings 15, 20 and 25 and a second opening 45 therein. The first openings 15, 20 and 25 may expose the first through third sub-pixel regions. In an exemplary embodiment, for example, each of the first openings 15, 20 and 25 may be located in the first through third sub-pixel regions, respectively. Thus, the reflective region 30 may substantially surround the first through third sub-pixel regions.

The reflective member, common lines, and insulation layers may be disposed in the reflective region 30. Here, the common lines may be electrically connected to the first through third sub-pixels. The reflective member, the common lines, and the insulation layers may be substantially disposed at different layers from each other among layers disposed on the first substrate (e.g., at different levels from each other). In an exemplary embodiment, for example, the insulation layer may be disposed on (e.g., above) the first substrate, and the pixel defining layer may be disposed on (e.g., above) the insulation layer. The pixel defining layer may substantially surround the first through third sub-pixels, and an upper electrode may be disposed on the pixel defining layer and on the first through third sub-pixels.

A second substrate may be disposed on and facing the upper electrode. Here, the reflective member may be disposed in the reflective region 30 on a lower surface of the second substrate. In exemplary embodiments, a planar shape of the reflective region 30 may be the same as that of the reflective member. In an exemplary embodiment, the overall reflective region 30 may include an area in which the second opening 45 is disposed in addition to an area in which the reflective member is disposed. The second opening 45 may expose a portion of the upper electrode. In addition, the common lines may overlap the reflective member. Thus, the common lines may not be disposed in a portion at which the second opening 45 is located. Further, a shape of the second opening 45 may be changed depending on an arrangement of the common lines. In an exemplary embodiment, for example, the second opening 45 may be a triangular opening, a square opening, a rectangular opening, a diamond opening, a polygonal opening, a track-shaped opening, or an elliptical opening.

A plurality of the second openings 45 may be respectively located in a plurality of the pixel regions 40. In exemplary embodiments, the second openings 45 may be irregularly arranged considering positions thereof among the plurality of the pixel regions 40. An arrangement of the second openings 45 within the plurality of the pixel regions 40 may be changed depending on an arrangement of the common lines in the plurality of the pixel regions 40. Accordingly, the OLED device may serve as a mirror OLED device in which the reflectivity thereof is controlled without a limitation for the arrangement of the common lines. In addition, since the second openings 45 have the irregular arrangement among the plurality of the pixel regions 40, the interference phenomenon of a light that travels through the second openings 45 may be relatively reduced.

Figure 9:
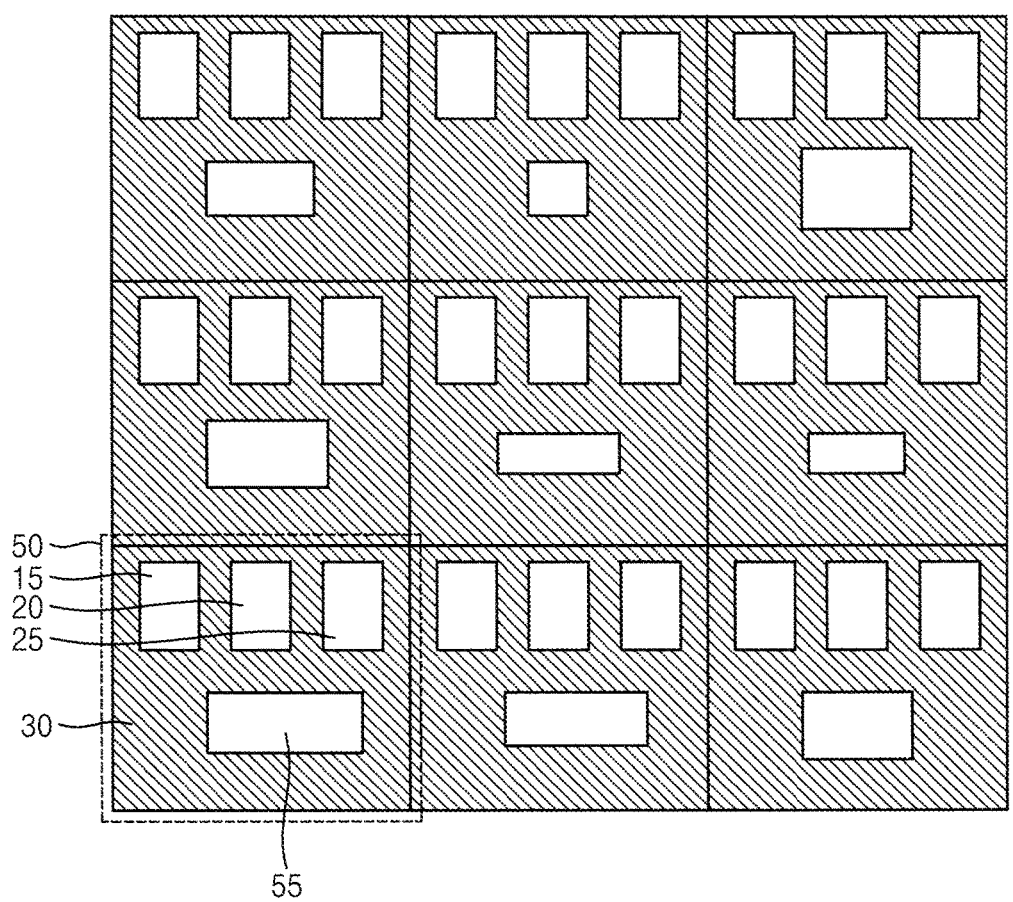
FIG. 9 is a planar view illustrating still another exemplary embodiment of an organic light emitting display device in accordance with the invention.

FIG. 9 is a planar view illustrating still another exemplary embodiment of an OLED device in accordance with the invention. An OLED device illustrated in FIG. 9 may have a configuration substantially the same as or similar to that of an OLED device 100 described with reference to FIG. 1 except a size of second openings 55 among a plurality of pixel regions 50. In FIG. 9, detailed descriptions for elements, which are substantially the same as or similar to the elements described with reference to FIG. 1, will be omitted.

Referring to FIG. 9, an OLED device may include a plurality of pixel regions defined therein. First through third sub-pixel regions and a reflective region 30 may be located in one pixel region 50. Here, a reflective member may be disposed in the reflective region 30, and the reflective member may define first openings 15, 20 and 25 and a second opening 45 therein. The first openings 15, 20 and 25 may expose the first through third sub-pixel regions. In an exemplary embodiment, for example, each of the first openings 15, 20 and 25 may be located in the first through third sub-pixel regions, respectively. Thus, the reflective region 30 may substantially surround the first through third sub-pixel regions.

In exemplary embodiments, a planar shape of the reflective region 30 may be the same as that of the reflective member. In an exemplary embodiment, the overall reflective region 30 may include an area in which the second opening 55 is disposed in addition to an area in which the reflective member is disposed. In addition, the common lines may overlap the reflective member. Thus, the common lines may not be disposed in a portion at which the second opening 55 is located. Further, a planar shape of the second opening 55 may be changed depending on an arrangement of the common lines. In an exemplary embodiment, for example, the second opening 55 may be a triangular opening, a square opening, a rectangular opening, a diamond opening, a polygonal opening, a track-shaped opening, or an elliptical opening.

A plurality of the second openings 55 may be respectively located in a plurality of the pixel regions 50. In exemplary embodiments, planar shapes of the second openings 55 may have different shapes from each other among the plurality of pixel regions 50. An arrangement of the second openings 55 within the plurality of the pixel regions 50 may be changed depending on an arrangement of the common lines. Accordingly, the OLED device may serve as a mirror OLED device in which the reflectivity thereof is controlled without a limitation for the arrangement of the common lines. In addition, since the second openings 55 have the different shapes from each other among the plurality of the pixel regions 50, the interference phenomenon of a light that travels through the second openings 55 may be relatively reduced.

Figure 10:
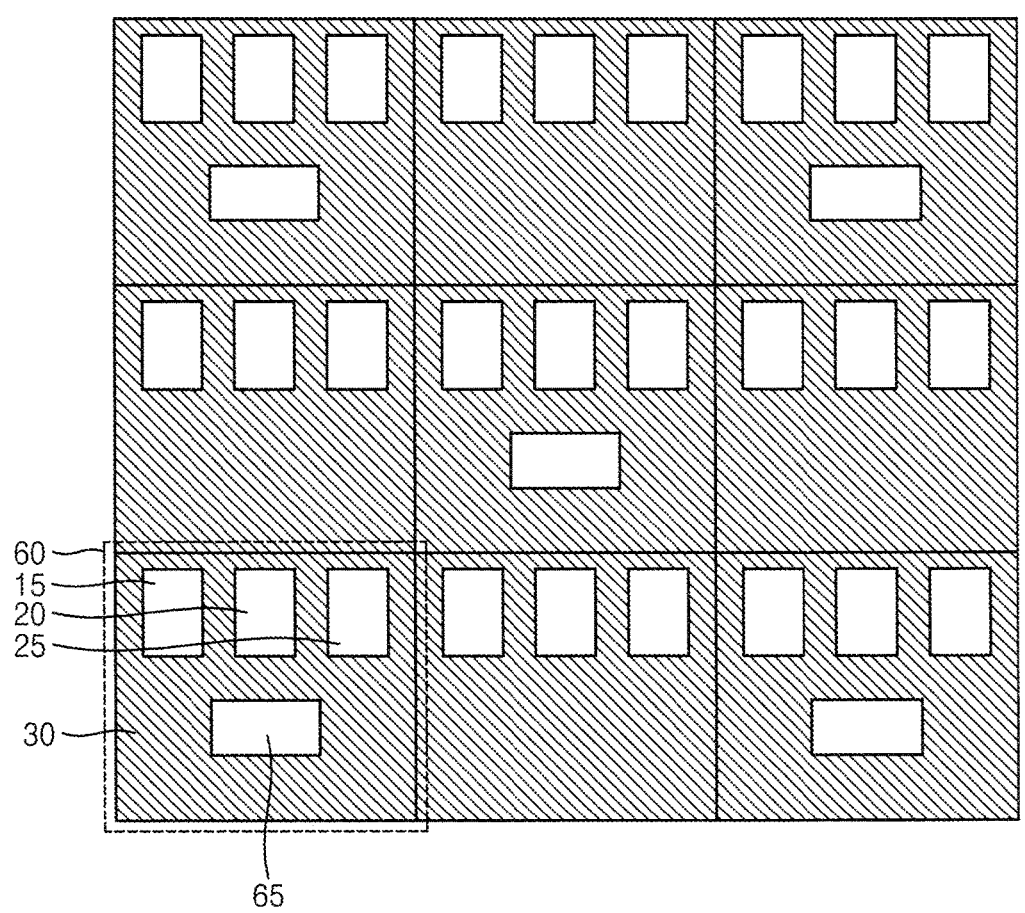
FIG. 10 is a planar view illustrating yet another exemplary embodiment of an organic light emitting display device in accordance with the invention.

FIG. 10 is a planar view illustrating yet another exemplary embodiment of an OLED device in accordance with the invention. An OLED device illustrated in FIG. 10 may have a configuration substantially the same as or similar to that of an OLED device 100 described with reference to FIG. 1 except an arrangement of second openings 65 among a plurality of pixel regions 60. In FIG. 10, detailed descriptions for elements, which are substantially the same as or similar to the elements described with reference to FIG. 1, will be omitted.

Referring to FIG. 10, an OLED device may include a plurality of pixel regions defined therein. First through third sub-pixel regions and a reflective region 30 may be located in one pixel region 60. Here, a reflective member may be disposed in the reflective region 30, and the reflective member may define first openings 15, 20 and 25 and a second opening 65 therein. The reflective region 30 may substantially surround the first through third sub-pixel regions.

In exemplary embodiments, a shape of the reflective region 30 may be the same as that of the reflective member. In an exemplary embodiment, the overall reflective region 30 may include an area in which the second opening 65 is disposed in addition to an area in which the reflective member is disposed. In addition, the common lines may overlap the reflective member. Thus, the common lines may not be disposed in a portion at which the second opening 65 is located. Further, a planar shape of the second opening 65 may be changed depending on an arrangement of the common lines. In an exemplary embodiment, for example, the second opening 65 may be a triangular opening, a square opening, a rectangular opening, a diamond opening, a polygonal opening, a track-shaped opening, or an elliptical opening.

A plurality of the second openings 65 may be located in a plurality of the pixel regions 60. In exemplary embodiments, the second openings 65 may be located in at least one reflective region 30 among two adjacent reflective regions 30. When the OLED device is used in a relatively dark place, a size and/or the number of the second opening 65 may be relatively small, and thus an area of the reflective member capable of reflecting an external light may be increased. Accordingly, a reflectivity of the reflective member may be decreased, and the visibility of the reflected image may be relatively increased.

Figure 11:
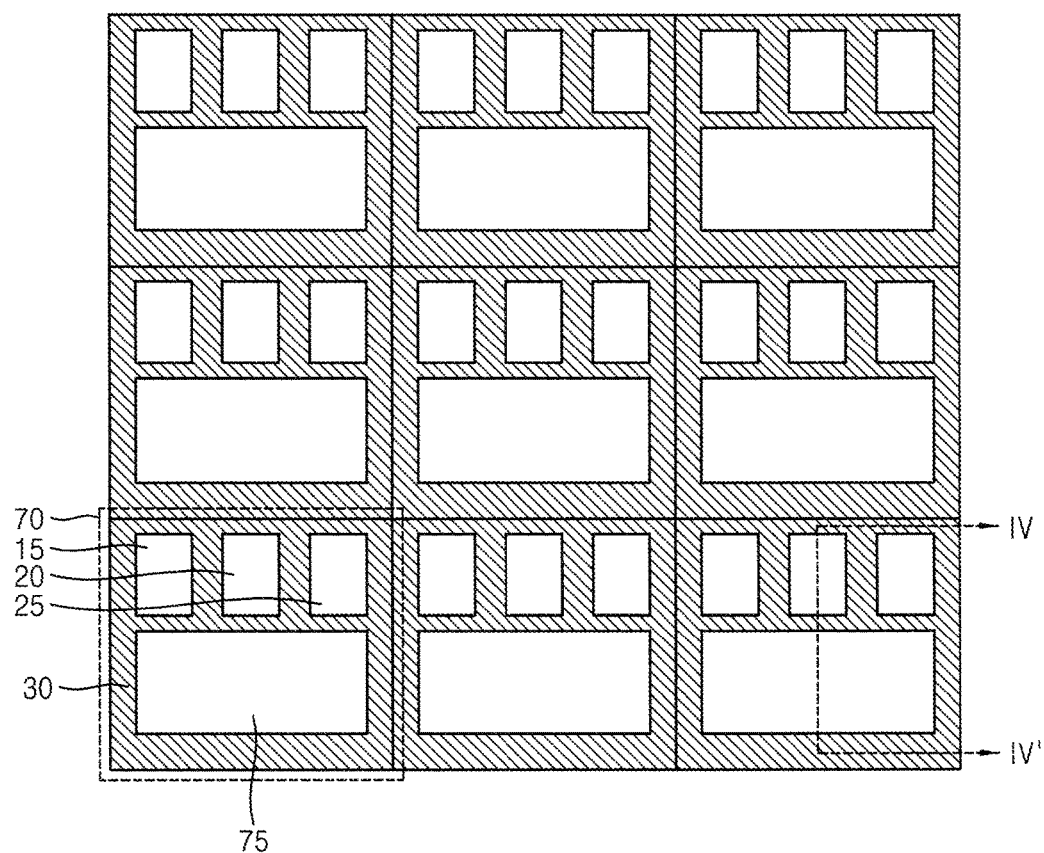
FIG. 11 is a planar view illustrating yet another exemplary embodiment of an organic light emitting display device in accordance with the invention.

FIG. 11 is a planar view illustrating yet another exemplary embodiment of an OLED device in accordance with the invention. An OLED device illustrated in FIG. 11 may have a configuration substantially the same as or similar to that of an OLED device 100 described with reference to FIG. 1 except a size of second openings 75. In FIG. 11, detailed descriptions for elements, which are substantially the same as or similar to the elements described with reference to FIG. 1, will be omitted.

Referring to FIG. 11, an OLED device may include a plurality of pixel regions defined therein. First through third sub-pixel regions, a reflective region 30, and a transparent region may be located in one pixel region 70. Here, a reflective member may be disposed in the reflective region 30, and the reflective member may define first openings 15, 20 and 25 and a second opening 75 therein. The reflective region 30 may substantially surround the first through third sub-pixel regions and the transparent region.

In exemplary embodiments, a shape of the reflective region 30 may be the same as that of the reflective member. In an exemplary embodiment, the overall reflective region 30 may include an area in which the second opening 75 is disposed in addition to an area in which the reflective member is disposed. In addition, the common lines may overlap the reflective member. Thus, the common lines may not be disposed in a portion at which the second opening 75 is located. In exemplary embodiments, a shape of the second opening 75 may have a planar shape of a rectangle. In addition, the second opening 75 may expose a transparent region of the OLED device. In an exemplary embodiment, for example, a size of the second opening 75 may be the substantially same as that of the transparent region.

A plurality of the second openings 75 may be located in a plurality of the pixel regions 70. In exemplary embodiments, the second openings 75 may serve as the transparent region (e.g., a transparent window). As the OLED device has the transparent window, the OLED device may serve as a transparent and mirror OLED device capable of simultaneously performing transmission and reflection of a light.

Figure 12:
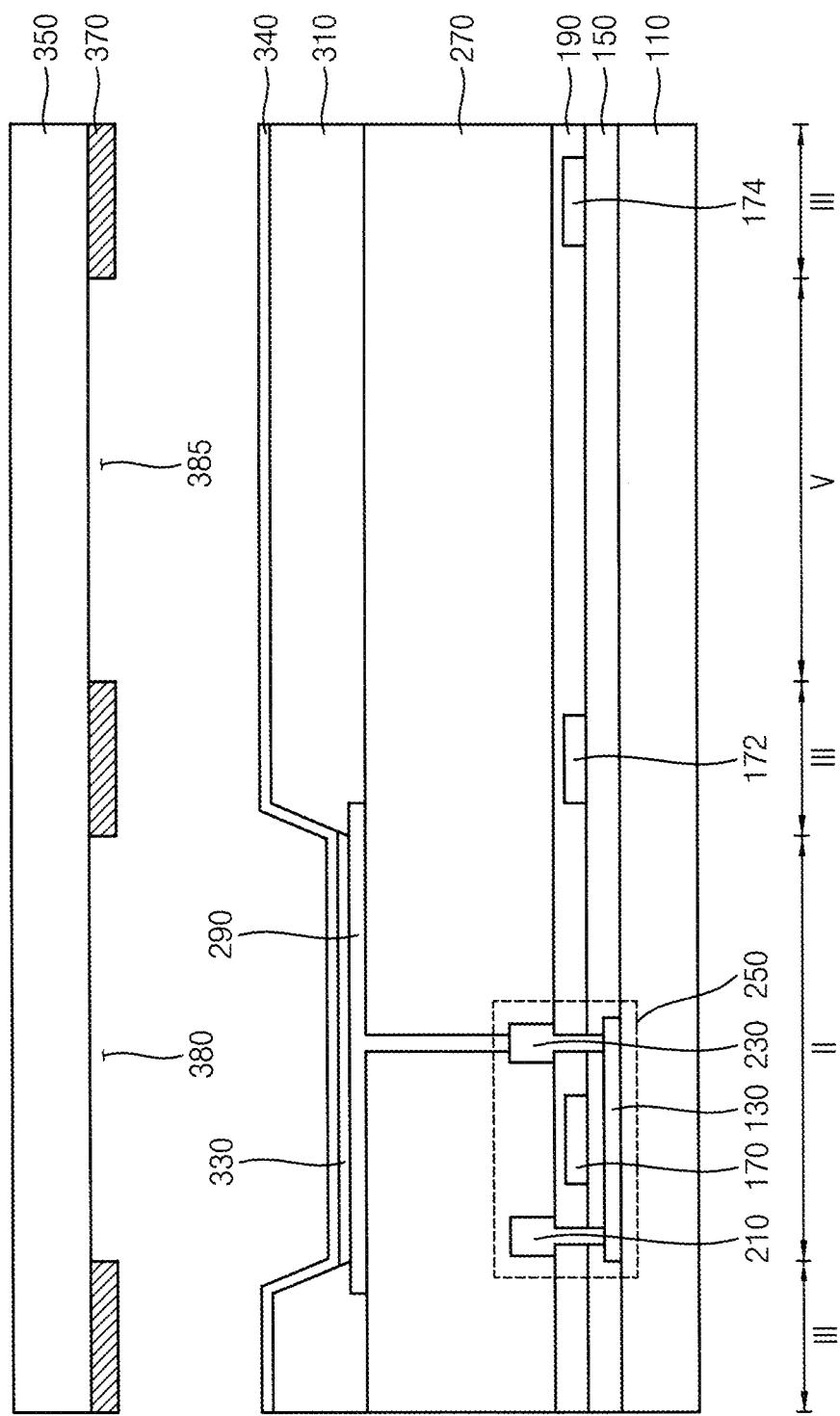
FIG. 12 is a cross-sectional view illustrating the organic light emitting display device taken along line I-I' of FIG. 11.

FIG. 12 is a cross-sectional view illustrating the OLED device taken along line I-I' of FIG. 11. An OLED illustrated in FIG. 12 may have a configuration substantially the same as or similar to that of an OLED 100 described with reference to FIG. 2 except a transparent region. In FIG. 12, detailed descriptions for elements, which are substantially the same as or similar to the elements described with reference to FIG. 1, will be omitted.

Referring to FIG. 12, an OLED device may include a first substrate 110, a first insulation layer 150, a second insulation layer 190, a third insulation layer 270, common lines 172 and 174, a light emitting structure, a pixel defining layer 310, a reflective member 370, a second substrate 350, etc. Here, the light emitting structure may include a semiconductor element 250, a lower electrode 290, a light emitting layer 330, and an upper electrode 340. The semiconductor element 250 may include an active layer 130, a gate electrode 170, a source electrode 210, and a drain electrode 230. The reflective member 370 may define a first opening 380 and a second opening 385 therein.

As described above, the OLED device may include a plurality of pixel regions 70. An individual one pixel region 70 may include a sub-pixel region II, a reflective region III and a transparent region V. The reflective region III may substantially surround the sub-pixel region II and the transparent region V, and a shape of the reflective region III may be the substantially same as that of the reflective member 370. Alternatively, where an overall reflective region is considered as excluding the sub-pixel region II, the transparent region V may be a portion of the reflective region excluding a remainder of the overall reflective region. The semiconductor element 250, the lower electrode 290, the light emitting layer 330, and a portion of the upper electrode 340 of the light emitting structure may be disposed in the sub-pixel region II. In addition, the reflective member 370 and the common lines 172 and 174 may be disposed in the reflective region III. Further, the second opening 385 may be disposed in the transparent region V.

In an exemplary embodiment, for example, an image may be displayed in the sub-pixel region II. An image of an object that is located in the front of the OLED device may be reflected in the reflective region III. An image of an object that is located in the rear (e.g., the back) of the OLED device may be transmitted in the transparent region V. Compared to the OLED device 100 illustrated in FIG. 2, a size of the second opening 385 illustrated in FIG. 12 may be relatively large. Since the common lines 172 and 174 overlap the reflective member 370, a distance from the common line 172 to the common line 174 may be increased. Alternatively, to increase a transmissivity, a portion at which the upper electrode 340 is disposed in the transparent region V may be removed on the pixel defining layer 310.

As the OLED device includes the reflective member 370 having the second opening 385 that exposes the transparent region V, the OLED device may serve as a transparent and mirror OLED device capable of both transmitting and reflecting a light.

The above-described exemplary embodiments according to the invention may be applied to various display devices including but not limited to an OLED device. In an exemplary embodiment, for example, one or more exemplary embodiment of the invention may be applied to vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light display device, comprising:
a first substrate including a plurality of pixel regions, each pixel region including: a plurality of sub-pixel regions, and a reflective region which surrounds the sub-pixel regions;
light emitting structures respectively in the sub-pixel regions of the first substrate;
a second substrate opposite to the first substrate; and
a reflective member on the lower surface of the second substrate,
wherein
the reflective region excludes each of the sub-pixel regions at which a light emitting structure is disposed,
within such reflective region, the reflective member defines first openings exposing the sub-pixel regions and a second opening spaced apart from the first openings, and
the light emitting structures do not overlap the second opening.

2. The organic light display device of claim 1, wherein a size of the second opening defined by the reflective member defines a reflectivity of the reflective member.

3. The organic light display device of claim 1, further comprising:
common lines in the reflective region, the common lines being electrically connected to the light emitting structures,
wherein the common lines overlap the reflective member which defines the first openings exposing the sub-pixel regions and the second opening spaced apart from the first openings.

4. The organic light display device of claim 3, wherein the common lines include a data line, a scan line or a power supply voltage line.

5. The organic light display device of claim 1, wherein in a plan view, the second opening is a triangular opening, a square opening, a rectangular opening, a diamond opening, a polygonal opening, a track-shaped opening or an elliptical opening.

6. The organic light display device of claim 1, wherein a planar size of the second opening is less than a planar size of each of the first openings.

7. The organic light display device of claim 1, wherein a planar size of the second opening is greater than a planar size of each of the first openings.

8. The organic light display device of claim 1, further comprising a plurality of second openings respectively in the plurality of pixel regions.

9. The organic light display device of claim 8 wherein the first and second openings have an arrangement in the each pixel region, the arrangements of the first and second openings being the same among the plurality of pixel regions.

10. The organic light display device of claim 8, wherein the first and second openings have an arrangement in the each pixel region, the arrangements of the first openings being the same among the plurality of pixel regions, and the arrangements of the second openings being different among the plurality of pixel regions.

11. The organic light display device of claim 8, wherein among the plurality of pixel regions, the second openings have the same shape as each other.

12. The organic light display device of claim 8, wherein among the plurality of pixel regions, the second openings have different shapes from each other.

13. The organic light display device of claim 8, wherein among the plurality of pixel regions, the second opening is located in the reflective region of at least one of two adjacent pixel regions.

14. The organic light display device of claim 13, wherein the second openings have an arrangement in the each pixel region, the arrangements of the second openings being the same among the plurality of pixel regions.

15. The organic light emitting display device of claim 13, wherein the second openings have an arrangement in the each pixel region, the arrangements of the second openings being different among the plurality of pixel regions.

16. The organic light emitting display device of claim 1, wherein within the reflective region which excludes each of the sub-pixel regions at which the light emitting structure is disposed,
the first substrate further includes a transparent region defined therein, and
the second opening defined by the reflective member exposes the transparent region of the first substrate.

17. The organic light emitting display device of claim 16, further comprising:
common lines in the reflective region, the common lines being electrically connected to the light emitting structures,
wherein the common lines overlap the reflective member which defines the first openings exposing the sub-pixel regions and the second opening spaced apart from the first openings.

18. The organic light emitting display device of claim 16, wherein a planar area of the transparent region is greater than a planar area of the remainder of the reflective region.

19. The organic light emitting display device of claim 16, wherein the transparent region excluding the remainder of the reflective region transmits therethrough an image of an object located at the first substrate side of the organic light emitting display device.

20. The organic light emitting display device of claim 1, wherein each of the light emitting structures includes:
a semiconductor element on the first substrate;
a lower electrode on the semiconductor element, the lower electrode being electrically connected to the semiconductor element;
a pixel defining layer exposing at least a portion of the lower electrode;
a light emitting layer on the exposed lower electrode; and
an upper electrode on the light emitting layer.

* * * * *